United States Patent [19]

Mizutani

[11] Patent Number: 4,506,279

[45] Date of Patent: Mar. 19, 1985

[54] METAL-OXIDE-SEMICONDUCTOR DEVICE WITH BILAYERED SOURCE AND DRAIN

[75] Inventor: Yoshihisa Mizutani, Tokyo, Japan

[73] Assignee: Tokyo Shibaura Denki Kabushiki Kaisha, Japan

[21] Appl. No.: 531,618

[22] Filed: Sep. 13, 1983

[30] Foreign Application Priority Data

Sep. 17, 1982 [JP] Japan ................................ 57-161652

[51] Int. Cl.³ .............................................. H01L 29/78
[52] U.S. Cl. .............................. 357/23.11; 357/23.12; 357/23.4; 357/23.1; 357/91; 357/64; 357/88
[58] Field of Search ............. 357/23.11, 91, 64, 23.3, 357/23.12, 23.4, 23.1, 88

[56] References Cited

U.S. PATENT DOCUMENTS 3,946,419  3/1976  DeWitt et al. .................... 357/23.11
4,040,082  8/1977  Goser ................................ 357/23.1

FOREIGN PATENT DOCUMENTS 72471     6/1978  Japan ................................ 357/23.1
7804028  10/1978  Netherlands ...................... 357/23.1

OTHER PUBLICATIONS

Bayraktaroglu et al., "First Anodic-Oxide GaAs MOSFETs Based on Easy Technological Processes, *Electronics Letters*, Jan. 22, 1976, vol. 12, No. 3, pp. 53–54.

*Primary Examiner*—Andrew J. James
*Assistant Examiner*—William A. Mintel
*Attorney, Agent, or Firm*—Finnegan, Henderson, Farabow, Garrett & Dunner

[57] ABSTRACT

A metal-oxide-semiconductor device comprising source and drain regions formed in the surface region of a semiconductor substrate, and a gate electrode formed on an insulation layer on the channel region between the source and drain regions. The drain region includes an upper layer and a lower layer having an impurity concentration higher than that of the upper layer.

4 Claims, 8 Drawing Figures

F I G. 3A
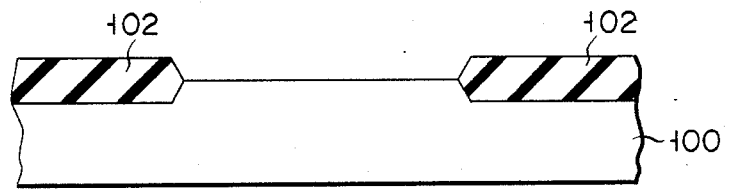
F I G. 3B
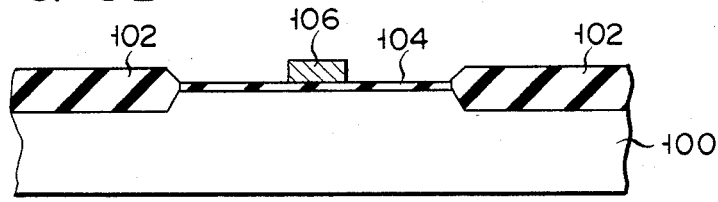

METAL-OXIDE-SEMICONDUCTOR DEVICE WITH BILAYERED SOURCE AND DRAIN

BACKGROUND OF THE INVENTION

The present invention relates to a metal-oxide-semiconductor (MOS) device suitable for high degree of integration. In accordance with improvements in the integration degree of MOS LSI, the channel length of the MOS FET is continually made shorter. Shortening the channel length leads to an improved switching speed, but produces the following probelms.

First of all, the so-called "short channel effect", i.e., gate threshold voltage is rapidly decreased if the channel length is smaller than a certain level, must be considered. FIG. 1, shows the relationship between the channel length and the gate threshold voltage. As seen from FIG. 1, only a small change in the channel length brings about a large change in the gate threshold voltage in short channel regions. Specifically, if the channel region is short, the influence of the depletion layer formed near the source and drain regions is considerable, resulting in a decreased gate threshold voltage. In general, the potential of the substrate in which the channel region is formed is equal or very close to that of the source region. Thus, the electric field between the source and drain regions is concentrated in the surface region of the channel near the drain region and, thus, is most intensified in the surface region. It follows that the depletion layer near the drain region imparts the greatest influence in the decrease of the gate threshold voltage.

A second problem to be noted is that, if the voltage applied between the source and drain electrodes is constant, a shortened channel length results in an intensified electric field in the channel region. This enhances the probability of impact ionization caused by the channel current. It should be noted that part of the electrons or holes generated by the impact ionization bounce over the energy gap between the semiconductor substrate and the gate insulation film and flow into the gate electrode, thereby producing a gate current. In some cases, the electrons or holes bouncing over the energy gap are trapped by the gate insulation film and cannot come out of the insulation film. In this case, the device characteristics such as the gate threshold voltage and the channel conductance are permanently changed, resulting in low reliability of the device.

FIG. 2 shows a prior art MOS FET designed to prevent the electric field from being intensified near the drain region, thereby solving the problems described above. It can be seen that an $n^+$-type layer 12 acting as the source region of an n-channel MOS FET and $n^+$-type regions 14, 16 collectively forming the drain region of the n-channel MOS FET are formed in the surface region of a p-type semiconductor substrate 10. The $n^+$-type layer 14, which is connected to a drain electrode 28, has a relatively high impurity concentration, i.e., about $1 \times 10^{19}/cm^3$, which is substantially equal to the impurity concentration of the source region 12. On the other hand, the $n^+$-layer 16 on the channel side has a relatively low impurity concentration, i.e., about $1 \times 10^{17}/cm^3$. A gate insulation film 18 is formed on the channel region, and a gate electrode 20 is formed on the gate insulation film 18. The MOS FET further comprises a field insulation film 22, an insulation film 24 and a source electrode 26.

In the construction shown in FIG. 2, part of the voltage applied between the source and drain electrodes is applied to the low impurity portion, i.e., the $n^+$-layer 16, of the drain region, with the result that it is possible to weaken the electric field concentrated in the channel region near the drain region in the conventional device. It follows that it is possible to prevent the changes in the gate threshold voltage, channel conductance, etc. However, the drain region contacting the channel region, i.e., the $n^+$-layer 16, has a high resistance because the impurity concentration is low. The high resistance mentioned leads to a low switching speed. Further, at least one additional masking is required compared with the ordinary method to produce a drain region with a high impurity layer and a low impurity layer, leading to a complex manufacturing process for the device.

SUMMARY OF THE INVENTION

One object of the present invention is to provide a metal-oxide-semiconductor device which permits shortening of the channel region without changing such device characteristics as the gate threshold voltage and the channel conductance.

According to the present invention, a metal-oxide-semiconductor device exists, comprising a semiconductor substrate, a source region formed in the surface region of the semiconductor substrate, a drain region of two-layer design formed in the surface region of the semiconductor substrate, including an upper layer and a lower layer having a higher impurity concentration than that of the upper layer, and a gate electrode formed on an insulation layer on a channel region between the source and drain regions.

BRIEF DESCRIPTION OF THE DRAWINGS

FIGS. 3A to 3F are cross sectional views collectively showing the process of producing a MOS device according to one embodiment of the present invention.

DETAILED DESCRIPTION OF THE PREFERRED EMBODIMENT

Figure 1:
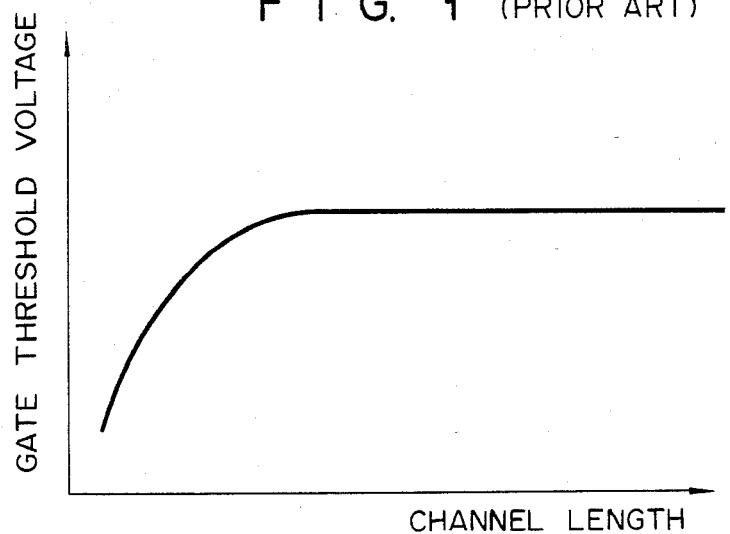
FIG. 1 is a graph showing the relationship between the channel length and the gate threshold voltage in a MOS device.
Figure 2:
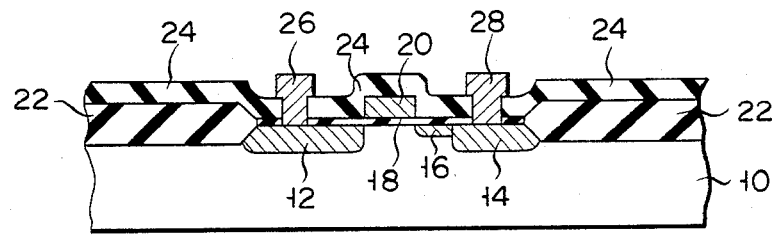
FIG. 2 is a cross sectional view showing a prior-art device having a short channel length.
Figure 3C:
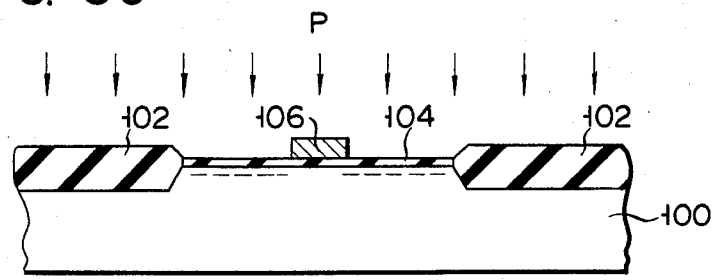
Figure 3D:
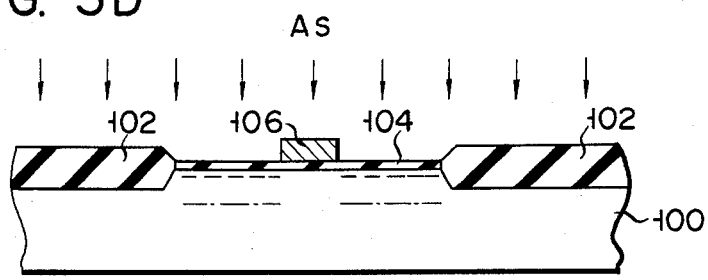

FIGS. 3A to 3F collectively show how to produce the MOS device. In the first step, a field oxide film 102 is formed on a p-type silicon substrate 100 by selective oxidation of the substrate surface as shown in FIG. 3A. Then, the wafer is heated at 1000° C. in an oxygen atmosphere to form an oxide film 104 having a thickness of about 250 Å on that surface of the substrate without the field oxide film. A platinum silicide (PtSi) film is then formed on the entire wafer surface by means of a sputtering technique. The undesired portion of the PtSi film is removed by photoetching to form a gate electrode 106 as shown in FIG. 3B. Then, phosphorus ions having an impurity concentration of $1 \times 10^{12}/cm^2$ are selectively implanted into the surface region of substrate 100 through the oxide film 104 under an implantation energy of 60 KeV as shown in FIG. 3C. In this ion implantation step, the gate electrode 106 and the field oxide film 102 are used as a mask. The phosphorus ions are implanted to a depth denoted by the broken lines in FIG. 3C. Then arsenic ions having an impurity concentration of $5 \times 10^{14}/cm^2$ are implanted into the surface region of the substrate 100 through the oxide film 104 under an implantation energy of about 700 KeV as shown in FIG. 3D. The gate electrode 106 and the field oxide film 102 are used as a mask in this ion implantation step, too. The arsenic ions are implanted to a depth denoted by the chain line in FIG. 3D.

Figure 3E:
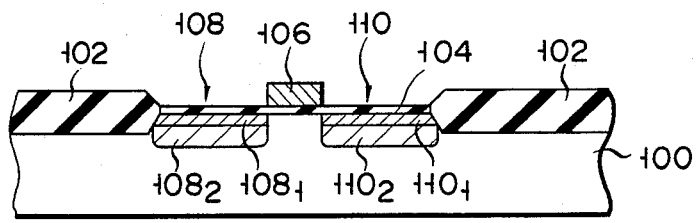
Figure 3F:
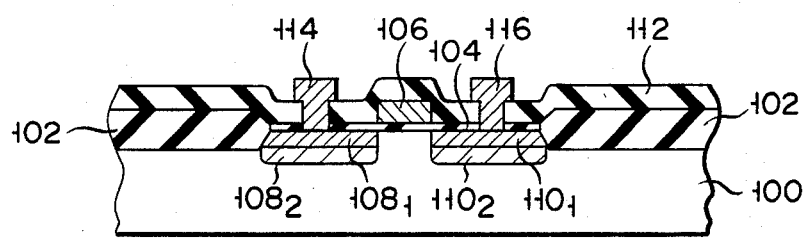

Then, the wafer is heated at 900° C. for about 20 minutes in a nitrogen atmosphere so as to activate the implanted phosphorus and arsenic ions. As a result, n-type semiconductor regions 108 and 110 acting as the source and drain regions, respectively, are formed as shown in FIG. 3E. Since the ion implantation is performed twice, the n-type semiconductor region 108 is a two-layer design consisting of an upper layer $108_1$ and a lower layer $108_2$. Likewise, the n-type semiconductor region 110 is of two-layer design consisting of an upper layer $110_1$ and a lower layer $110_2$. The upper layers $108_1$ and $110_1$ are formed by the phosphorus ion implantation and have a low impurity concentration. But, the lower layers $108_2$ and $110_2$, which are formed by the arsenic ion implantation, have a relatively high impurity concentration. In this embodiment, the upper layers $108_1$ and $110_1$ have an impurity concentration of $1 \times 10^{17}/cm^3$ and a thickness of 0.15 $\mu$m, with the lower layers $108_2$ and $110_2$ having an impurity concentration of $1 \times 10^{19}/cm^3$ and a thickness of 0.8 $\mu$m. After activation of the implanted ions, an insulation film ($SiO_2$ film) 112 is formed on the entire wafer surface with a thickness of 8,000 Å by CVD as shown in FIG. 3F. Then, contact holes are made in the $SiO_2$ film 112, and aluminum wirings 114 and 116 are respectively connected to the n-type semiconductor regions 108 and 110 through the contact holes to provide source and drain electrodes, thereby producing the desired n-channel MOS FET.

In the embodiment described above, the source and drain regions 108 and 110 are formed of the upper layers $108_1$ and $110_1$ having a low impurity concentration and lower layers $108_2$ and $110_2$ having a high impurity concentration, respectively. As a result, the electric field is weakened in the surface region below the gate electrode 106, i.e., in the channel region, allowing the depletion layer to extend into the source and drain regions. In this manner it is possible to prevent the electric field between the source and drain regions from being concentrated in the channel region near the drain region. It is also possible to prevent the gate threshold voltage from being lowered by the influence of the depletion layer through a decrease in the channel length. Further, since the electric field in the channel region is weakened, impact ionization is less likely to occur. Even if impact ionization occurs, the electrons or holes are unlikely to be trapped in the gate insulation film, with the result that no change occurs in the gate threshold voltage and channel conductance. What should also be noted is that the entire drain region has a low resistance because the lower layer $110_2$ of the drain region has a high impurity concentration, with the result that the MOS FET can be operated at high speed.

Like the drain region, the source region can consist of two layers, though it is not absolutely necessary for the source region to consist of two layers because the source region of two-layer design is not as effective as the drain region of two-layer design. It should be noted, however, that if both the source and drain regions are of two-layer design, an additional masking as in the prior art is made unnecessary, making it possible to simplify the manufacturing process of the device. Also, the MOS FET comprising source and drain regions of two-layer design can be effectively used where the source and drain regions are reversed, e.g., where the MOSFET is used as a transfer gate of a SRAM.

In the embodiment shown in FIG. 3F, the lower layers $108_2$ and $110_2$ of the source and drain regions have a high impurity concentration. Thus, if the channel length is short, a punch-through current tends to flow between these lower layers. The problem can be prevented by increasing the impurity concentration of the channel region near the lower layers of the source and drain regions by means of ion implantation, for example. Also, since the surface regions of the source and drain regions have a low impurity concentration, good ohmic contact with the aluminum wirings may not occur. In such a case, an n-type impurity is selectively diffused into the source and drain regions after formation of the contact holes in the insulation film 112 through the contact holes to increase the impurity concentration in the contact portions with the aluminum wirings.

In the embodiment shown in FIG. 3F, ion implantation is employed for forming the source and drain regions. However, it is also possible to form, in advance, a highly concentrated n-type impurity diffusion layer, and then introduce a p-type impurity such as boron into the surface region of the diffusion layer by means of diffusion or ion implantation so as to decrease the n-type impurity concentration in the surface region. Further, high and low impurity concentration layers may be formed in a single step by a channeling ion implantation method. Although the gate electrode is formed of PtSi in the embodiment shown in FIG. 3F, materials other than PtSi may also be used to construct the gate electrode including, for example, W, Mo, Pd, silicides thereof, Pt, and polysilicon doped with impurities such as P, As and B. While a silicon substrate is used in the embodiment of FIG. 3F, substrates of other semiconductors such as Ge and GaAs and a substrate prepared by growing a semiconductor layer on an insulating substrate, i.e., a so-called "SOS" structure, may also be used in the present invention. Further, the technical idea of the present invention can be applied not only to an n-channel MOSFET but also to a p-channel MOSFET and a CMOSFET.

As described above in detail, the present invention provides a MOS device constructed to allow the channel length to be shortened without changing such device characteristics as gate threshold voltage and channel conductance. The MOS device is, thus, suitable for enhancing the degree of integration.

What is claimed is:

1. A metal-oxide-semiconductor device comprising:
   a semiconductor substrate;
   a source region formed in the surface region of the semiconductor substrate;
   a drain region of two-layer design formed in the surface region of the semiconductor substrate, including an upper layer and a lower layer having a higher impurity concentration than that of the upper layer; and
   a gate electrode formed on an insulation layer on the channel region between the source and drain regions.

2. A device according to claim 1, wherein the source region includes an upper layer and a lower layer having an impurity concentration higher than that of the upper layer.

3. A device according to claim 2, wherein the source and drain regions are each formed by high and low concentration ion implantations.

4. A device according to claim 3, wherein the lower layer is thicker than the upper layer in each of the source and drain regions.

* * * * *